United States Patent [19]

Silver

[11] 3,836,366

[45] Sept. 17, 1974

[54] PLANOGRAPHIC PRINTING PLATES AND METHOD FOR THEIR PREPARATION

[75] Inventor: Julius L. Silver, Manchester, Conn.

[73] Assignee: Lith-Kem Corporation, Lynbrook, L. I., N.Y.

[22] Filed: Sept. 11, 1972

[21] Appl. No.: 288,042

[52] U.S. Cl. .......................... 96/33, 96/75, 96/91 R, 96/68, 101/456, 101/457, 101/467

[51] Int. Cl. .............................................. G03f 7/02

[58] Field of Search ........... 96/75, 68, 33, 91 R, 67; 101/456, 457, 467

[56] References Cited

UNITED STATES PATENTS

| | | | |
|---|---|---|---|
| 2,649,373 | 8/1953 | Neugebauer et al. | 96/75 |
| 2,679,498 | 5/1954 | Seven et al. | 96/91 R |
| 2,937,085 | 5/1960 | Seven et al. | 96/91 R |
| 3,231,382 | 1/1966 | Silver | 96/115 R |
| 3,294,533 | 12/1966 | Sus et al. | 96/75 |
| 3,353,984 | 11/1967 | Landau | 96/75 |
| 3,479,182 | 11/1969 | Chu | 96/75 |
| 3,484,241 | 12/1969 | Euleth et al. | 96/75 |
| 3,522,042 | 7/1970 | Borchers et al. | 96/75 |
| 3,554,751 | 1/1971 | Thomas | 96/91 R |
| 3,615,532 | 10/1971 | Silver | 96/75 |

*Primary Examiner*—Ronald H. Smith
*Assistant Examiner*—Edward C. Kimlin

[57] ABSTRACT

A planographic printing plate base coated with a polymeric hydrophilic material sensitizable by a diazo compound wherein the surface of the polymeric hydrophilic material is coated with a diazo resin sensitizer and a diazonium salt sensitizer. The resulting printing plate is highly resistant to "scumming" over extended usage, is also highly resistant to dot sharpening and is characterized by quick start-up and long run.

8 Claims, No Drawings

PLANOGRAPHIC PRINTING PLATES AND METHOD FOR THEIR PREPARATION

BACKGROUND OF THE INVENTION:

The present invention relates to photosensitized planographic printing plates and to a method for their preparation.

At the present time virtually all printed copy is produced through the use of three basic types of printing plates. One type is a relief plate which prints from a raised surface. Another type is an intaglio plate which prints from a depressed surface. The third type is the planographic plate which prints from a flat surface which is neither raised above nor depressed below the adjacent and surrounding non-printing area.

Planographic printing plates have water-repellent (hydrophobic), oil-receptive (oleophilic) image areas, and waterreceptive (hydrophilic) non-image areas. Offset lithography is the most widely known printing method which employs planographic printing plates. One type of lithographic plate is prepared by applying a thin coating of a diazonium resin to a suitable support material, exposing the coating to the action of light passing through a negative of the picture to be printed causing the diazonium resin coating to become oil receptive in the image area, and then washing away the unexposed, unreacted coating with a suitable developer. Since the plate support material is itself water-receptive, those portions of the plate from which the unreacted coating has been removed by the developer solution become the non-image areas.

Diazo-type lithographic printing plates are not durable in that the image areas gradually abrade with normal press-room practice. Various lacquers and other coatings are sometimes employed to retard the rate of wearing down of image areas.

The non-image areas of the lithographic plates are the bared grained zinc or aluminum surface of the base. The bared metal areas are water-receptive. These exposed metal non-image areas suffer loss of water receptivity because corrosion and pitting occur. To retard this corrosion and pitting, it is necessary with plates having bared metal in the non-image areas to keep a protective hydrophilic coating in these areas, generally by periodic application of a gum arabic solution (or of a gum-type substitute) to the non-image areas.

These disadvantages due to the metal are mostly eliminated in plates in which the non-image areas are comprised of waterinsoluble, hydrophilic resins. Plates with such hydrophilic coatings have, however, only found widespread use on paper or paper-plastic laminates, i.e., generally for short lengths of run, because the resins which have the properties of insolubility in water, and hydrophilicity are not very abrasion resistant. One synthetic resin system which is abrasion resistant and tough, in addition to being water-insoluble and hydrophilic, and which has successfully been used as the photosensitizable base for planographic printing plates, is the association product of a normally solid, water soluble ethylene oxide polymer and a phenolic resin formed by the condensation of a phenolic compound and an aldehyde, e.g. formaldehyde (U.S. Pat. Nos. 3,231,381 and 3,309,202). This synthetic resin may be photosensitized either by incorporating a photosensitizing agent in the synthetic resin coating or by coating the resin layer with a photosensitizing agent.

The agents release free radicals upon exposure to light which react with the resinous components of the printing plate surface to produce image and non-image areas.

There are, unfortunately, several disadvantages associated with the use of association product based printing plates. One of the most serious drawbacks to the use of such resinous coatings is that the hydrophilic or water attractive character of the nonimage areas of the synthetic resin coating gradually disappears over extended usage and the plates begin to "scum," i.e., the hydrophilic areas become oleophilic or ink receptive. This "scumming" shortens the life of the printing plate due to the gradual deterioration of the resin base.

This "scumming" effect may be reduced by ensuring that the synthetic resin base is substantially completely cured, i.e., insolubilized, either by the use of a curing agent, heating to an elevated temperature, etc.

With printing plates having a resin base as discussed in U.S. Pat. Nos. 3,231,381 and 3,309,202 it has been determined that diazonium salts can be used as a photosensitizing agent. While not certain of the mechanism involved and not wanting to be limited thereto, it appears that such salts react with the resin base to form oleophilic image areas upon exposure to light. It has been further found, however, that photosensitization of such fully cured synthetic resin bases with the class of photosensitizers known as diazonium salts and the subsequent use of the printing plates is severely inhibited by extensive curing of the resin. Thus, the fully cured plates are difficult to properly "start" with the class of photosensitizers known as diazonium salts, although the diazonium salts will produce plates which may be employed without dot sharpening or dot loss. Where the plates have a lower degree of curing, the diazonium salts are satisfactory with respect to "starting;" however, the plates have a decreased run life and are subject to "scumming" after only limited usage.

Diazo resin photosensitizers have been well known in the art. However, the employment of diazo resin photosensitizers on synthetic resin based plates as discussed above does not alleviate all of the above noted disadvantages encountered when diazonium salts are used. Thus, it has been found that the diazo resin sensitized fully cured resin base plates have a rapid "start-up;" however, the plates are subject to premature dot loss or dot sharpening.

Since the diazo type photosensitizers are among the most advantageous sensitizers currently in use it would be highly desirable to produce diazo photosensitizable, hydrophilic, fully cured synthetic resin base printing plates which are not subject to "scumming" and which will yield well-defined copies over extended usage.

SUMMARY OF THE INVENTION:

It has been found that planographic printing plate bases comprising substrates coated with a particular resinous hydrophilic material which is photosensitizable by a diazo compound reactive to light to define hydrophobic, oleophilic printing and hydrophilic non-printing areas in the hydrophilic material may be advantageously sensitized by coating the surface of the hydrophilic material with a diazo resin photosensitizer and a diazonium salt photosensitizer. The diazo resin and diazonium salt may be incorporated in and deposited from a single solution, or may be deposited sequentially. If deposited sequentially, the diazo resin should be deposited first and dried and then the diazonium salt deposited to avoid adverse effects of the resin solvent on the salt.

It has been found that the above described coating operation, particularly when applied to certain substantially fully cured photosensitizable synthetic resin base materials produces printing plates which have a long run-life with no attendant "scumming" after extended usage, which are capable of rapid start-up and which are not subject to dot loss or dot sharpening.

DETAILED DESCRIPTION OF THE INVENTION:

The invention is particularly adapted to those printing plates containing the photosensitizable surfaces described in U.S. Pat. Nos. 3,231,381 and 3,309,202, the disclosures of which are included herein by reference.

Briefly, the photosensitizable surfaces described in these patents comprise the association product of an ethylene oxide polymer and a phenolic resin formed by the condensation of a phenolic compound and an aldehyde, e.g., formaldehyde. More specifically, these association products comprise from about 0.2 to about 3.0 parts by weight of ethylene oxide polymer per part of phenolic resin.

These association products may be substantially fully cured to lengthen the run life of the printing plates prepared therefrom and to avoid scumming after extended usage by heating at elevated temperatures up to about 165° C., depending upon the particular resin components employed.

The ethylene oxide polymer component of the compositions is selected from water soluble resinous ethylene oxide polymeric materials having an average molecular weight in the range of from about 50,000 to about 10,000,000 which are readily soluble in water. The term "ethylene oxide polymers" refers to polymers possessing the repeating unit ($CH_2$—$CH_2O$—) as represented by the class of commercial Polyox resins; and the term is intended to include water soluble ethylene oxide polymer resins wherein ethylene oxide is the predominant monomer polymerized therein but which can also contain polymerized residues of other olefin oxides as exemplified by copolymers and terpolymers of ethylene oxide with other copolymerizable monomers containing single epoxide groups such as propylene oxide, butylene oxide, styrene oxide and the like. Poly(ethylene oxide) homopolymer is however preferred as the ethylene oxide polymer resin and shall be used hereinafter as representative of these resins.

The phenolic resin component of the compositions of the present invention are the heat fusible condensation products of a phenol with an aldehyde. Such condensation products are divided into two classes, resoles and novolaks, either of which can be used in this invention as shown hereinafter. These two types of resins are discussed in order below. Both of these classes of phenolic resins will form in association with ethylene oxide polymers a photosensitizable composition and when placed on a support as a thin film and cured, will comprise a planographic printing plate suitable for reproduction of large numbers of faithfully detailed copies.

While these phenolic resins are in the fusible form when making the association product the fusible condition is not necessarily a critical condition of the association product, in which it is possible for a portion or all of the phenolic resin component be fully advanced to the cured state.

The fusible resole phenolic resins can advance upon heating to a degree of cure and polymerization to attain a completely insoluble state. These insoluble phenolics cannot be used in the preparation of the present compositions but are believed to be present in the cured printing plate compositions of this invention. In the preparation of thé present compositions only those heat fusible phenolic resins which are soluble in water, alkali or organic solvents such as acetone, ethanol and the like and which are sufficiently fusible to permit admixture and association with the ethylene oxide polymers can be used. These resins include those resole phenolic resins which have not cured to a degree of insolubility as well as the novolak resins which are more particularly described in the above U.S. Patents.

Representative of the suitable phenolic resins include the polynuclear methylol substituted phenol resole intermediates, e.g., trimethylolphenol, prepared by condensing a phenol (e.g., phenol, cresol, xylenol, chlorophenol, etc.) with an aldehyde or aldehyde liberating compound (e.g., formaldehyde, acetaldehyde, acrolein, crotonaldehyde, 1,3,5-trioxane, ketones, hexamethylenetetramine) capable of undergoing phenol-aldehyde condensation. Also suitable are the so-called novolak resins which are prepared from similar reactants under acidic conditions.

It is to be understood, however, that any of the association products described in the above U.S. Patents may be employed in the printing plates of the present invention.

The various additives and/or fillers described in the above noted patents, e.g., organic sulfonic acids, bichromates, polyhydric phenols, etc., may be incorporated in the photosensitizable material. It is to be understood, however, that their presence is not essential to the practice of the invention.

Planographic printing plate bases may be prepared by dissolving the association product in a suitable solvent, e.g., N,N-dimethylformamide and mixtures of cellosolve or ethanol and water, and applying the solution on a suitable supporting base by any conventional coating operation, e.g., dipping, rolling, etc. Suitable supporting bases include water-proofed paper, glass, metal (e.g., aluminum, steel, zinc, etc.) plates or foils, etc. The coatings may be sequentially applied with intermediate drying so as to produce an overall coating of any desired thickness.

The resinous coating is then completely cured by heating at an elevated temperature, i.e., about 165° C. for a time sufficient to completely insolubilize the coating.

As discussed above, this complete curing of the resinous coating avoids the problem of "scumming" over extended usage of the printing plate. However, complete curing of the plates also results in extreme difficulties in photosensitizing the plates with diazo compounds. According to the present invention, these difficulties are overcome by coating the photosensitizable surface with a diazo resin and a diazonium salt in either a single or a sequential operation.

It is a feature of the invention that the diazo resin and diazonium salt can be applied separately and in the order stated. The advantages of the present invention can also be achieved by applying the diazo resin and diazonium salt from the same solution. However, if the diazo resin and diazonium salt are combined in a single solution, the solubilities of each in the single solution are mutually reduced.

The diazo resin and salt are suitably coated on the photosensitizable surface according to any of the well known coating methods, e.g., roller coating, blade coating, dipping, spraying etc.

Any of a wide variety of solvents which are inert with respect to the remainder of the photosensitizable composition may be employed if the resin and salt are being deposited sequentially. Care should be taken, however, to ensure that the solvent employed for application of the diazonium salt be a non-solvent for the previously applied diazo resin in order to avoid removing all or a part thereof.

The concentrations of the diazo resin and diazonium salt in either a single or respective solutions will vary depending on the amounts of each to be deposited on the plate. It will be apparent that the concentration of a particular diazo sensitizer will depend upon its solubility characteristics in the particular solvent employed and also on the particular coating procedure used.

The diazo resin sensitizer and the diazonium salt sensitizer are applied to the photosensitizable surface in an amount sufficient to provide, after drying, a preferred weight ratio of diazo resin to diazonium salt of from about 2:1 to about 1:2. It is preferred to maintain the above ratio of diazo resin to diazonium salt in that an insufficient amount of diazonium salt will result in undue image wear in the printing operation and an insufficient amount of diazo resin will result in slow start-up on the printing machine. It will be noted, however, that the ratio of diazonium salt to diazo resin may vary from the limits stated above depending on the particular printing applications involved.

Any of the well known diazonium salt sensitizers may be employed in the practice of the invention. Typical among these are:

a. *p*-diazo-N,N-diethylaniline zinc chloride
b. *p*-diazo-N,N-dimethylaniline zinc chloride
c. *p*-diazo-N-methyl-N-hydroxyethylaniline zinc chloride
d. *p*-diazo-N-ethyl-N-hydroxyethylaniline zinc chloride
e. *p*-diazo-N-diethyl-*o*-toluidine zinc chloride
f. *p*-diazo-N-dimethyl-*m*-toluidine zinc chloride
g. *p*-diazo-N-diethyl-*m*-phenetidine zinc chloride
h. *p*-diazo-*o*-chloro-N,N-diethylaniline zinc chloride Generally, any of the generic class of diazo salts described in U.S. Pat. No. 2,667,415, the disclosure of which is incorporated herein by reference, may be utilized in the practice of the invention.

Any of the diazo resin sensitizers well known in the prior art may be employed in the practice of the invention. These generally comprise the condensation products of aldehydes (e.g., formaldehyde) and the above mentioned diazonium salts. These condensation products are more particularly described in U.S. Pat. No. 2,667,415.

As stated above, any suitable solvent for the diazonium salts and diazo resin sensitizers may be utilized in the practice of the invention.

Typical among the solvents which may be utilized to apply the diazo resin are:

Water
A mixture of water and ethanol (3:2 by vol)
A Mixture of water and methanol (3:2 by vol)

Examples of suitable solvents for the diazonium salt include methanol, ethanol, *n*-propanol and isopropanol, each with minor amounts of water.

As will be apparent to those skilled in the art, any suitable solvent for the diazo resin and diazonium salt sensitizers, respectively, which are inert with respect to the remainder of the printing plate may be utilized in the practice of the invention.

Without intending to be bound by any particular theory as to the operating mechanism of the printing plates of the invention incorporating the diazo resin, diazonium salt dual sensitizer in a base of an association product of an ethylene oxide and a phenolic resin, it is believed that the diazo resin sensitizers are photodecomposed to produce phenols which couple with the undecomposed diazo resin to produce an ink-receptive surface. This printing surface acts primarily as a matrix which is highly ink-receptive after exposure but which eventually wears away after extended usage of the printing plate. At the same time, the diazonium salt produces highly reactive carbonium ions upon photodecomposition which react with the polyethylene oxide moiety of the association product surface resulting in chain cleavage in the polyethylene oxide with an attendant loss of the cleaved low molecular weight poly(ethylene oxide) fragments and an increase in the oleophilicity of the printing surface. This reaction between the diazonium salt and the poly(ethylene oxide) occurs and creates an oleophilic surface while the ink receptive surface of the diazo resin reaction is being worn away through usage. This permanent change in the oleophilic areas of the printing surface ensures increased ink receptivity even after the diazo resin produced matrix image described above wears away.

It has been found, for example, that the diazo resin sensitizers would "start" the fully cured printing plates sufficiently and allow the diazonium salt sensitizers to "take over" and run the plates without dot loss or sharpening far in excess of 50,000 impressions without scumming.

Additionally, it has been found that the presence of diazonium salt improves the shelf-life properties of the plates, i.e., polymeric association product based plates sensitized with diazonium resin and diazonium salt have better shelf-life than such plates sensitized only with diazonium resin.

EXAMPLE NO. 1

12 grams of Union Carbide Corp. WSR 301 (poly(ethylene oxide)) plus 12.4 grams of Union Carbide Corp. BRL 1031 (a 65 percent solution of phenolic resin) is dissolved in 500 grams of N,N-dimethylformamide using a high speed stirrer. The resulting solution is coated onto brush-grained aluminum by means of a reverse-roller coater. A coating of 10 thousands of an inch is applied. The coating is dried and baked for 20 minutes at 165° C. The resulting material contains approximately 1 gram of coating per sq. ft. The material at this point is hydrophilic but not photosensitive. The material was photosensitized utilizing Diazo Resin No. 4 supplied by Fairmount Chemical Co.: a formaldehyde condensation product of p-diazo diphenylamine supplied as the zinc chloride double salt and a diazonium salt: DE-40 supplied by Fairmount Chemical Co. This material is *p*-diazodiethylaniline zinc chloride. The photosensitizers are applied from solutions:

Solution A — 50 grams of Diazo Resin No. 4 is dissolved in a mixture of 1,666 grams of water and 833 grams of denatured alcohol. The solution is filtered and stored away from light until ready for use.

Solution B — 50 grams of DE-40 is dissolved in 2500 grams of denatured ethyl alcohol as a solvent.

For efficient use there is employed two pans large enough to soak plates in and two two-roll coaters. Solution A is in pan No. 1 and coater No. 1 and Solution B is in pan No. 2 and coater No. 2.

The plate is soaked in pan No. 1 and then while wet put through coater No. 1. The coating imbibes sensitizer uniformly and the excess is squeezed off by the rolls. When the plate is dry it is rinsed in pan No. 2 and then put through coater No. 2.

The plate when dry is stored for later use or used at once. The plate is exposed in the usual fashion, i.e., in a vacuum frame which holds a half-toned negative with or without line-work against the plate facing a source of light, i.e. a carbon-arc. After proper exposure the plate is rinsed in water which removes the unused sensitizer and causes the plate to no longer be light sensitive. The plate is then placed on an offset printing press. Prints of excellent quality were obtained and the plate produced well over 100,000 prints before wear was evident.

EXAMPLE NO. 2

A coating solution is prepared by dissolving 8 grams of Union Carbide Corp. resin BRN 2120 (a solid "resole" phenolformaldehyde resin) plus 12 grams of Union Carbide Polyox WSR 301 in a solvent mixture of 100 gms. of water plus 100 gms. of methyl ethyl ketone plus 300 gms. of cellosolve (a product of Union Carbide Corp. Cellosolve is 2-ethoxy-ethanol-1). The solution is used to apply a coating to a plate of sand blasted aluminum litho sheet. The coated plate after baking for 20 minutes at 165° C. is ready to be sensitized. Sensitizing is done as in Example 1 except that:

Solution A is 5 percent Diazo Resin No. 4 in water containing 0.1 percent polyvinyl alcohol for improved wetability of the plate by the sensitizing solution.

Solution B is 5 percent Diazo 545-F (a product of General Aniline and Film Corp. which is *p*-diazo-N,N-diethyl-*m*-phenetidine, zinc chloride) in methanol.

EXAMPLE NO. 3

Using the same unsensitized plates as prepared in Example No. 1, the plates are sensitized as in Example 1 using:

Solution A — 5 percent Diazo Resin No. 4 in a solvent combination which is nine parts water to one part methanol. The methanol is used to improve wetability of the solution on the plate and Solution B — 5 percent DE-2 (supplied by Fairmount Chemical Co. DE-2 is *p*-diazo-N-ethyl-*o*-toluidine zinc chloride) in a 90 percent methanol, 10 percent water solution.

What is claimed is:

1. A planographic printing plate comprising:

a substrate coated with a hydrophilic material of an association product of an ethylene oxide polymer and phenolic resin formed by the condensation of a phenol with an aldehyde, which association product is photosensitizable by a diazo compound relative to light to define hydrophobic, oleophilic printing and hydrophilic non-printing areas in said hydrophilic material; and a coating of diazo resin sensitizer and diazonium salt sensitizer on said association product, wherein said diazo resin upon exposure to light becomes photodecomposed to define first oleophilic areas, and said diazonium salt upon exposure to light reacts with said association product to define second oleophilic areas corresponding to said first oleophilic areas.

2. A planographic printing plate as in claim 1 wherein:

said coating is an intimate mixture of diazo resin sensitizer and diazonium salt sensitizer.

3. A planographic printing plate as in claim 1 wherein said coating includes:

a layer of diazo resin sensitizer on said hydrophilic material; and a layer of diazonium salt sensitizer on the layer of diazo resin.

4. The planographic printing plate base of claim 1 wherein said association product hydrophilic material comprises:

the cured association product of an ethylene oxide polymer and a phenolic resin formed by the condensation of a phenolic compound and an aldehyde.

5. The planographic printing plate of claim 4 wherein said association product comprises from about 0.2 to about 3.0 parts by weight of ethylene oxide polymer per part of phenolic resin.

6. The planographic printing plate of claim 1 wherein the weight ratio of said diazo resin to said diazonium salt in said coating is from about 2:1 to about 1:2.

7. The planographic printing plate of claim 1 wherein said diazo resin is the condensation product of an aldehyde and a diazo salt.

8. The planographic printing plate base of claim 7 wherein said aldehyde is formaldehyde.

* * * * *